United States Patent
Tai et al.

(10) Patent No.: US 10,649,059 B2
(45) Date of Patent: May 12, 2020

(54) MULTI-CHANNEL DETECTING SYSTEM

(71) Applicant: DELTA ELECTRONICS, INC., Taoyuan (TW)

(72) Inventors: Yen-Po Tai, Taoyuan (TW); Yen-Hung Wu, Taoyuan (TW); Po-Lin Chou, Taoyuan (TW); Zheng Fei Fang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 173 days.

(21) Appl. No.: 16/016,079

(22) Filed: Jun. 22, 2018

(65) Prior Publication Data

US 2019/0277936 A1    Sep. 12, 2019

(30) Foreign Application Priority Data

Mar. 7, 2018 (CN) .......................... 2018 1 0187921

(51) Int. Cl.
*G01R 35/00* (2006.01)
*H03F 1/26* (2006.01)
*H03F 3/45* (2006.01)
*G01R 1/30* (2006.01)

(52) U.S. Cl.
CPC ............. *G01R 35/005* (2013.01); *G01R 1/30* (2013.01); *H03F 1/26* (2013.01); *H03F 3/45071* (2013.01); *H03F 2200/129* (2013.01); *H03F 2200/144* (2013.01); *H03F 2200/267* (2013.01); *H03F 2203/45151* (2013.01); *H03F 2203/45524* (2013.01); *H03F 2203/45526* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,034,516 B2* | 4/2006 | Ammar | ................ | G01K 11/006 324/76.14 |
| 7,403,010 B1* | 7/2008 | Hertz | .................... | H03M 1/188 324/318 |
| 2010/0007334 A1* | 1/2010 | Apfel | ...................... | H04L 12/10 324/123 R |
| 2014/0212133 A1* | 7/2014 | Kobayashi | ........ | H04B 10/07955 398/25 |
| 2016/0344483 A1* | 11/2016 | Kareisto | ................ | H04B 17/12 |

* cited by examiner

Primary Examiner — Son T Le
(74) Attorney, Agent, or Firm — Hauptman Ham, LLP

(57) ABSTRACT

A multi-channel detecting system is disclosed. The multi-channel detecting system includes one or more signal-generating units, one or more detecting units, one or more amplifying units, and a calibration unit; the one or more signal-generating units are configured to provide a plurality of signals, the one or more detecting units are configured to detecting a plurality of signals from the one or more signal-generating units and transmitting through a plurality of calibration samples and generating corresponding quantized values; the one or more amplifying units electrically connected to the one or more detecting units are configured to amplify the quantized values; the calibration unit electrically connected to the one or more amplifying units is configured to calibrate the one or more amplifying units to make amplified quantized values provided by the amplifying units to be equal to one or more specific values.

14 Claims, 8 Drawing Sheets

MULTI-CHANNEL DETECTING SYSTEM

BACKGROUND

Technical Field

The present disclosure relates to a detecting device and, more particularly, to a multi-channel detecting system.

Description of Related Art

Multi-channel detecting systems is utilized for detecting physical property of analytes by a plurality of signals from signal generator for improving detecting accuracy and speed; however, the manufacturing tolerance of the electronic components and assembling tolerance affect the detection result caused by different detecting references of different channels.

SUMMARY

According to one aspect of the present disclosure, a multi-channel detecting system including one or more signal-generating units, one or more detecting units, one or more amplifying units, and a calibration unit is provided. The one or more signal-generating units are configured to provide a plurality of signals; the one or more detecting units are configured to detect the signals from the one or more signal-generating units and transmitted through a plurality of calibration samples and then generate a plurality of quantized values in accordance with the signals from the one or more signal-generating units and transmitted through the calibration samples. The one or more amplifying units are electrically connected to the one or more detecting units; the one or more amplifying units receive the quantized values and configured to amplify the quantized values. The calibration unit is electrically connected to the one or more amplifying units and configured to calibrate the one or more amplifying units to ensure that the amplified-quantized values from one or more amplifying units to be equal to one or more specific values.

According to another aspect of the present disclosure, a multi-channel detecting system including one or more signal-generating units, one or more detecting units, one or more amplifying units, and a calibration unit is provided. The one or more signal-generating units are configured to provide a plurality of signals; the one or more detecting units are configured to detect the signals provided by the one or more signal-generating units and transmitted through a plurality of calibration samples and then generate a plurality of quantized values in accordance with the signals from the one or more signal-generating units and transmitted through the calibration samples. The one or more amplifying units are electrically connected to the one or more deterring units; the amplifying units receiver the quantized values and configured to amplify the quantized values. The calibration unit is electrically connected to the one or more signal-generating units and configured to calibrate the one or more signal-generating units to ensure that the quantized values with respect to the signals from the one or more signal-generating units to be equal to one or more specific values.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
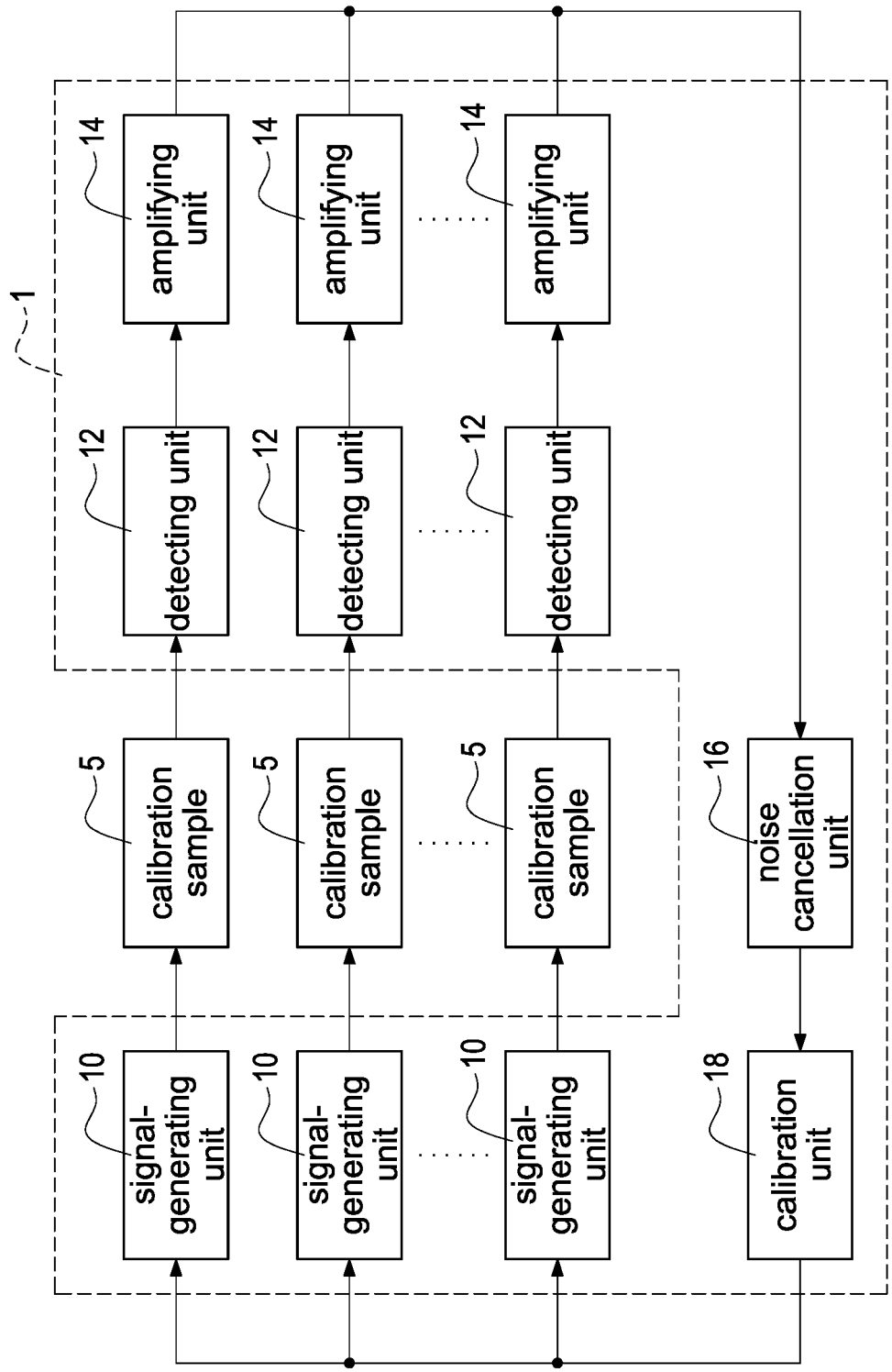
FIG. 1 depicts a schematic diagram illustrating the usage of a multi-channel detecting system in accordance with a 1st embodiment of the present disclosure.

FIG. 1 depicts a schematic diagram illustrating the usage of a multi-channel detecting system in accordance with a 1st embodiment of the present disclosure. In FIG. 1, the multi-channel detecting system 1 includes a plurality of signal-generating units 10, a plurality of detecting units 12, a plurality of amplifying units 14, a noise cancellation unit 16, and a calibration unit 18, and is configured to detect physical property of analyte(s) (not shown) by signals provided by the signal-generating units 10; the multi-channel detecting system 1 of the present disclosure is used for providing extremely rapid and accurate detection.

A calibration procedure may be preferentially performed before the multi-channel detection system 1 detects the analyte(s) to allow the signals provided by the signal-generating units 10 and transmitted through the calibration samples 5 to be equal to one or more specific values; the one or more specific values act as detecting reference during the detection procedure is performed.

In the present disclosure, the signals provided by the signal-generating units 10 are analog signals, such as optical signals or electrical signals. In FIG. 1, arrow denotes the transmission direction(s) of the (optical or electronic) signals. The multi-channel detecting system 1 for providing the optical signals is scanned to excite analytes that are labeled with fluorescent tags to detect any emitted light waves from the analytes for determining, for example, species or concentration of the analytes. The multi-channel detecting system 1 for providing electrical signals is conducted to the analytes to detect, for example, the maximum threat voltage and/or current capability of electronic components or the dissociation degree of (electrolyte) solutions.

During performing the calibration procedure, the multi-channel detecting system 1 detects transmitted signals passing through the calibration samples and generates corresponding quantized values by the detecting units 12 and then calibrates the signal-generating units 10 in accordance with the (amplified) quantized values by the calibration unit 18 to ensure that the quantized values transmitted through the calibration samples 5 are equal to one or more specific values. Therefore, the difficulty in recognizing the detection result is overcome and the accuracy of detection result during detection procedure is improved. It should be noted that the multi-channel detecting system 1 of the present disclosure performs the calibration procedure to calibrate the signals provided by the signal-generating units 10 while it is just assembled; when the quantized values are equal to the one or more specific values, it is favorable of prevent the manufacturing tolerance of the electronic components and assembling tolerance from affecting the detection result caused by different detecting references.

In FIG. 1, the amount of the signal-generating units 10 is equal to that of the calibration samples 5, and each of the signal-generating units 10 is configured to provide a signal for detection. In addition, the amount of the detecting units 12 and the amplifying units 14 are respectively equal to that of the calibration samples 5. As such, each of the detecting units 12 is configured to receive the quantized value generated by the signal provided by corresponding signal-generating unit 10 and transmitted through corresponding calibration sample 5, and the amplifying unit 14 is configured to amplify the quantized value provided by corresponding detecting unit 12.

The calibration samples 5 may be electrically connected to the signal-generating units 10 for receiving the signal provided therefrom when the signal-generating units 10 are configured to provide electrical signals. The detecting units 12 may be electrically connected to the calibration samples 5 for receiving (analog) signal and generating (analog) quantized values output from the calibration samples 5. The detecting units 12 are, for example, voltmeters, ammeters or pressure sensors.

When the signals provided by the signal-generating units 10 are optical signals, the calibration samples 5 may have wavelength-converting properties or a portion thereof may be optical-transparent. The (optical) signals are emitted to an optical path by the signal-generating units 10, and the calibration samples 5 are arranged on the optical path. When the calibration samples 5 are optical-transparent, at least a portion of the optical signals from the signal-generating units 10 can transmit through the calibration samples 5 to form transmitting (optical) signals. When the calibration samples 5 have wavelength-converting properties, a wavelength-conversion (optical) signals can be generated upon excitation by the (optical) signals from the signal-generating units 10. The detecting units 12 then receive the transmitting (optical) signals or the wavelength-conversion (optical) signal mentioned above and generate corresponding (analog) quantized values. In the present disclosure, the detecting units 12 may be charge coupled devices, complementary metal-oxide-semiconductors, spectrum analyzers, photodiodes or photomultiplier tubes.

Figure 2:
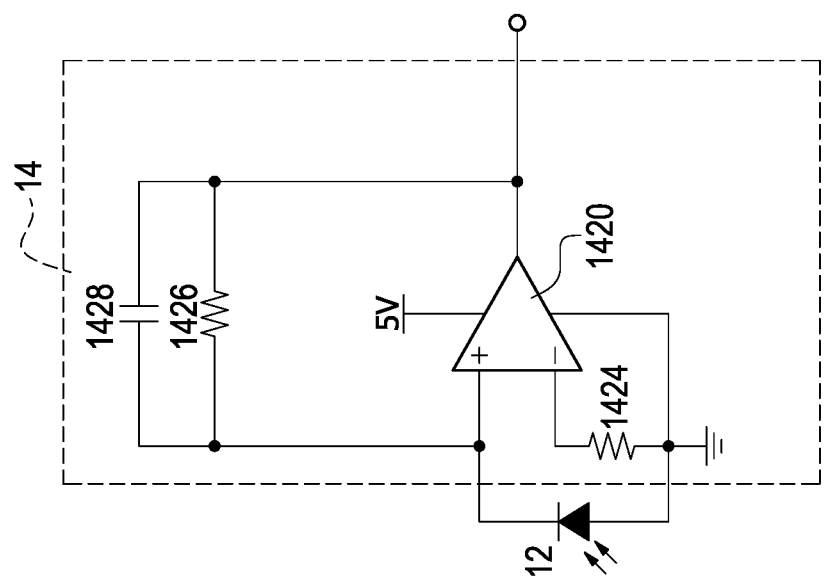
FIG. 2 depicts a circuit diagram of an amplifying unit in accordance with the 1st embodiment of the present disclosure.
Figure 4:
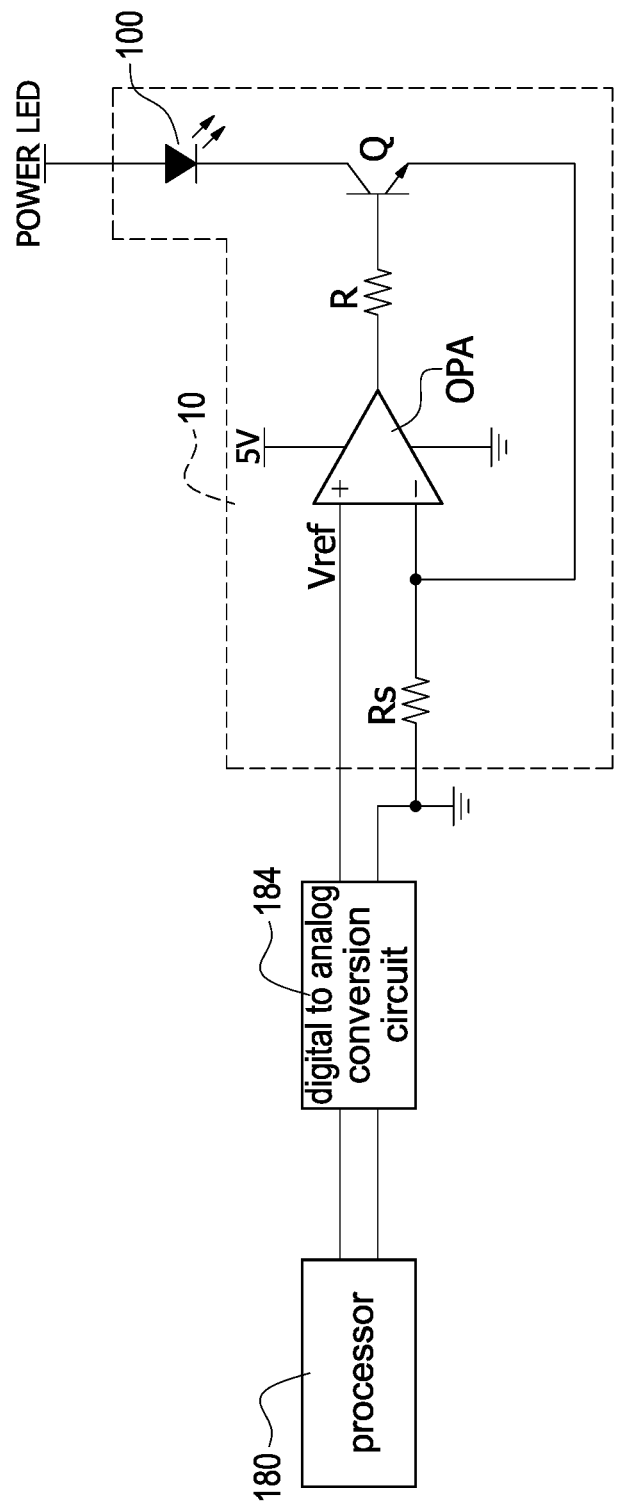
FIG. 4 depicts a circuit diagram of a signal-generating unit in accordance with the 1st embodiment of the present disclosure.

In this embodiment, the signal-generating units 10 for providing a plurality of signals are light emitting diodes (as shown in FIG. 4), and the detecting units 12 are photodiodes (as shown in FIG. 2). It should be noted that the signal-generating unit 10 may be separately provide signal to perform the calibration procedure, respectively, to prevent the signal interference between different channels of the multi-channel detecting system 1. However, two or more signal-generating units 10 may collectively provide signals to perform the calibration procedure to reduce a calibration time.

Each amplifying unit 14 is arranged between the one of the detecting units 12 and the noise cancellation unit 16 and electrically connected thereto for respectively amplifying the quantized value from the detecting unit 12 and then generating an amplified signal. In this embodiment, the quantized values from the detecting units 12 may be amplified at least one order of magnitude, and a maximum amplification of each amplifying unit 14 may be of the order of magnitude of ten.

In general, the photodiode detects the (optical) signal and then generates a current signal in accordance with the intensity of the (optical) signal. The current signal from the photodiode is not in favor of subsequent processing since it is extremely weak, therefore an amplifier for converting the current signal to a voltage signal and then amplifying the voltage signal is needed to ensure that the accuracy of detection. The amplifying unit 14 shown in FIG. 2 is utilized for converting the current signal from the photodiode to corresponding voltage signal and then amplifying the voltage signal.

FIG. 2 depicts a circuit diagram of an amplifying unit in accordance with the 1st embodiment of the present disclosure. In FIG. 2, the amplifying unit 14 may include a first operational amplifier 1420, its non-inverting input terminal (+) is electrically connected to the cathode of the photodiode to implement the detecting unit 12, and the anode of the photodiode is grounded. The non-inverting input terminal (+) of the first operational amplifier 1420 is further electrically connected to one terminal of a resistor 1426, and the other terminal of the resistor 1426 is electrically connected to the output terminal of the first operational amplifier 1420. A capacitor 1420 is electrically connected to the resistor 1426 in parallel. An inverting input terminal (−) of the first operational amplifier 1420 is electrically connected to one terminal of a resistor 1424, and the other terminal of the resistor 1424 is grounded. The resistor 1426 connected across the non-inverting input terminal (+) and the output terminal of the first operational amplifier 1420 is utilized for changing the gain of the amplifying unit 14 and converting the current signal from the photodiode to the (amplified) voltage signal.

With referring again to FIG. 1; the noise cancellation unit 16 is arranged between the amplifying units 14 and the calibration unit 18 and electrically connected thereto for cancelling noise within the amplified signals; the amplified signals without noise is then transmitted to the calibration unit 18. The calibration unit 18 is further electrically connected to the signal-generating units 10 and configured to calibrate the signal-generating units 10 to ensure that the quantized values with respect to the signals from the signal-generating units 10 and transmitted through the calibration samples 5 to be equal to the specific value.

Figure 3:
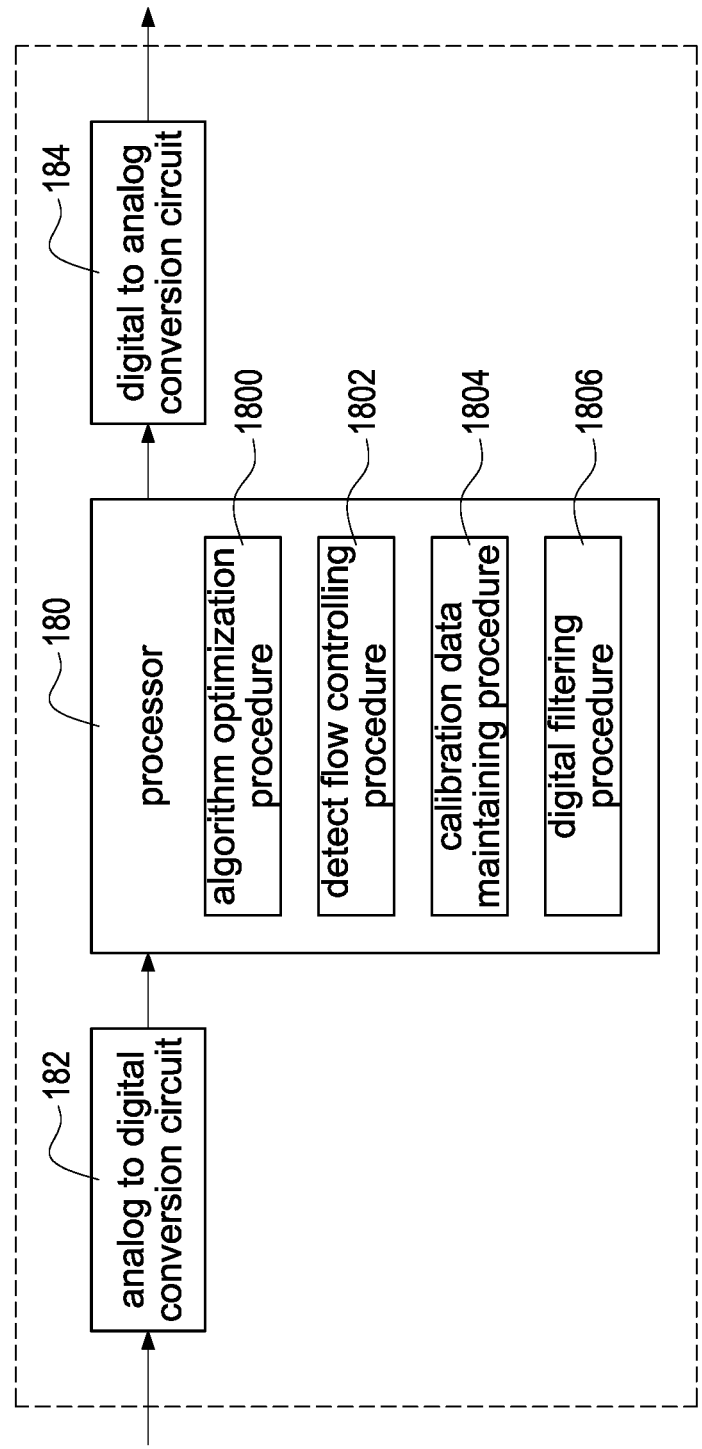
FIG. 3 depicts a circuit block diagram of a calibration unit in accordance with the 1st embodiment of the present disclosure.

FIG. 3 depicts a circuit block diagram of a calibration unit in accordance with the 1st embodiment of the present disclosure. In FIG. 3, the calibration unit 18 includes a processor 180, an analog to digital (A/D) conversion circuit 182, and a digital to analog (D/A) conversion circuit 184; the processor 180 is arranged between the A/D conversion circuit 182 and the D/A conversion circuit 184 and electrically connected thereto. The A/D conversion circuit 182 may be electrically connect to the noise cancellation unit 16 (shown in FIG. 1) for receiving the analog electronic signal from the noise cancellation unit 16 and configure to convert the analog electronic signal into a digital electronic signal. In the present disclosure, the processor 180 may previously perform a digital filtering procedure 1806 for filtering the noise within the digital electronic signal and then performs one of a detect flow controlling procedure 1802, a calibration data maintaining procedure 1804, and an algorithm optimization procedure 1800 for generating the digital calibration signal. In should be noted that the D/A conversion circuit 184 is, for example, configured to converting the digital calibration signal from the processor 180 to an analog reference voltage Vref, as shown in FIG. 4.

FIG. 4 depicts a circuit diagram of a signal-generating unit in accordance with the 1st embodiment of the present disclosure. For sake of convenient explanation, FIG. 4 also illustrates the processor 180 and the D/A conversion circuit 184 of the calibration unit 18. In FIG. 4, the signal-generating unit 10 includes a light emitting diode (LED) 100, an operational amplifier OPA, a switch Q, and a resistor R; the D/A conversion circuit 184 may be electrically connected to the processor 180 via, for example, and inter-integrated circuit ($I^2C$) bus, and the operational amplifier OPA is electrically connected to the D/A conversion circuit 184.

Specifically, the non-inverting input terminal (+) of the operational amplifier OPA is electrically connected to the D/A conversion circuit 184 for receiving the analog reference voltage Vref, and its output terminal is coupled to one terminal of the resistor R; the other terminal of the resistor R is connected to the switch Q. In this embodiment, the switch Q is a bipolar transistor which base is electrically connected to the resistor R, its collector is electrically connected to the cathode of the LED 100, and its emitter is electrically connected to the inverting input terminal (−) of the operational amplifier OPA and one terminal of a sensing resistor Rs; the anode of the LED 100 is connected to a power source POWER LED, and the other terminal of the sensing resistor Rs is grounded. The sensing resistor Rs senses the current flowing through the LED 100 and provides a current-sensing voltage to the inverting input terminal (−) of the operational amplifier OPA; the operational amplifier OPA receives the analog reference voltage Vref entering the non-inverting input terminal (+) thereof and the current-sensing voltage entering the inverting input terminal (−) thereof and compare the voltages.

When the reference voltage Vref is larger than the current-sensing voltage, the output level of the operational amplifier OPA is increased for reducing the conduction resistance of the switch Q, so that the illumination of the LED 100 is therefore enhanced. On the contrary, when the reference voltage Vref is smaller than the current-sensing voltage, the output level of the operational amplifier OPA is decreased for increasing the conduction resistance of the switch Q, so that the illumination of the LED 100 is therefore decreased. The current flowing through the LED 100 is repeatedly regulated in accordance with the comparison between the current-sensing voltage and the reference voltage Vref until the current-sensing voltage is equal to the reference voltage Vref; as a result, the quantized value with respect to the (optical) signal from the LED 100 and transmitted through the calibration sample 5 can be equal to the specific.

Figure 5:
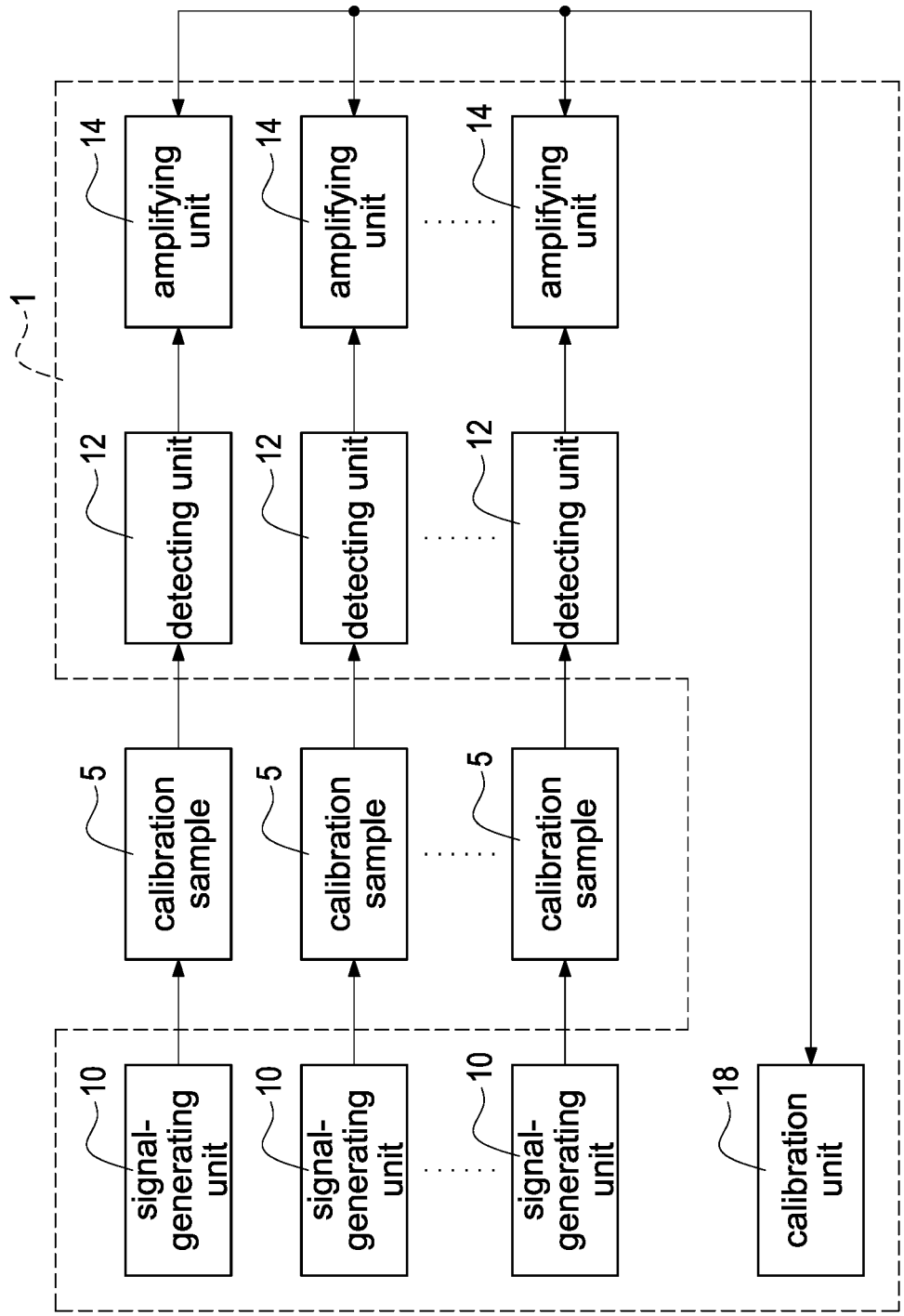
FIG. 5 depicts a schematic diagram illustrating the usage of a multi-channel detecting system in accordance with a 2nd embodiment of the present disclosure.

FIG. 5 depicts a schematic diagram illustrating the usage of a multi-channel detecting system in accordance with a 2nd embodiment of the present disclosure. In FIG. 5, the multi-channel detecting system 1 includes a plurality of signal-generating units 10, a plurality of detecting units 12, a plurality of amplifying units 14, and a calibration unit 18; the multi-channel detecting system 1 is configured to detect quantized values with respect to signals from the signal-generating unit 10 and transmitted through calibration samples 5 to ensure that the quantized values to be equal to one or more specific values. Therefore, the difficulty in recognizing the detection result is overcome and the accuracy of detection result during detection procedure is improved.

Each signal-generating unit 10 is configured to provide a signal; in this embodiment, the amount of the signal-generating units 10 is equal to that of the calibration samples 5, the amount of the detecting units 12 is equal to that of the calibration samples 5, and the amount of the amplifying unit 14 is equal to that of the calibration samples 5. As such, each of the detecting units 12 is configured to generate the quantized value by the signal from the corresponding signal-generating unit 10 and transmitted through the corresponding calibration sample 5, and each amplifying unit 14 is configured to amplify the quantized value provided by the corresponding detecting unit 12 and then generate an amplified signal. The calibration unit 18 receives the amplified signals from the amplifying units 14 and configured to calibrate each amplifying unit 14 to ensure that the amplified signals from the amplifying units 14 are equal to one or more specific values.

Figure 6:
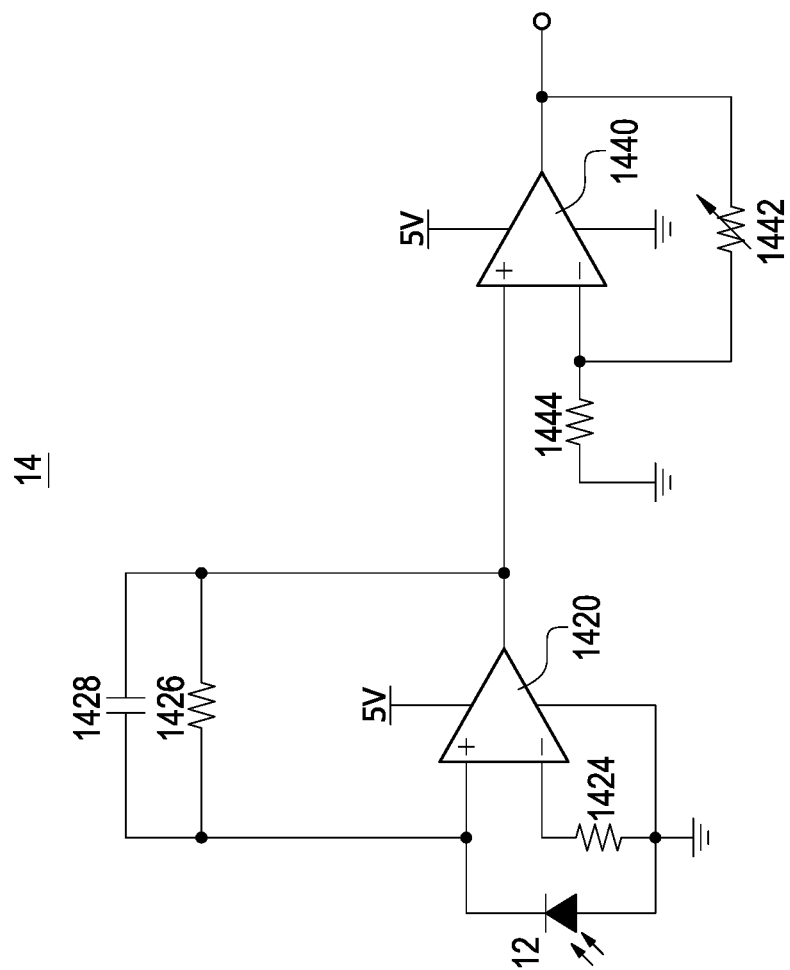
FIG. 6 depicts a circuit diagram of an amplifying unit in accordance with the 2nd embodiment of the present disclosure.

FIG. 6 depicts a circuit diagram of an amplifying unit in accordance with the 2nd embodiment of the present disclosure. In FIG. 6, each amplifying unit 14 is arranged between one of the detecting unit 12 and the calibration unit 18 and electrically connected thereto for respectively amplifying the quantized value from the detecting unit 12 and filtering the noise within the quantized value and then generating the amplified signal to the calibration unit 18.

More specifically, the amplifying unit 14 includes a first operational amplifier 1420 and a second operational amplifier 1440. A non-inverting input terminal (+) of the first operational amplifier 1420 is electrically connected to the cathode of the photodiode to implement the detecting unit 12; the anode of the photodiode is grounded. The non-inverting input terminal (+) of the first operation amplifier 1420 is further electrically connected to one terminal of the resistor 1426, and the other terminal of the resistor 1426 is electrically connected to the output terminal of the first operational amplifier 1420. A capacitor 1428 is electrically connected to the resistor 1426 in parallel. An inverting input terminal (−) of the first operational amplifier 1420 is electrically connected to one terminal of a resistor 1424, and the other terminal of the resistor 1424 is grounded. In the present disclosure, the resistor 1426 connected across the non-inverting input terminal (+) and the output terminal of the first operational amplifier 1420 is utilized for determining the gain of the signal entering the first operational amplifier 1420 and converting the current signal from the photodiode to the (amplified) voltage signal; i.e., adjust a form of the quantized values. The non-inverting input terminal (+) of the second operational amplifier 1440 is electrically connected to the output terminal of the first operational amplifier 1420; the inverting input (−) of the second operational amplifier 1440 is not only electrically connected to its output via a variable resistor 1442, but also grounded via a resistor 1444. Specifically, one terminal of the variable resistor 1442 is electrically connected to the inverting input terminal (−) of the second operational amplifier 1440, and the other terminal of the variable resistor 1442 is electrically connected to the output terminal of the second operational amplifier 1440; one terminal of the resistor 1444 is electrically connected to the inverting input terminal (−) of the second operational amplifier 1440, and the other terminal of the resistor 1444 is grounded. It should be noted that when the gain of the amplifying circuit collectively formed by the second operational amplifier 1440, the variable resistor 1442, and the resistor 1444 is G, the resistance of the variable resistor 1442 is R1, and the resistance of the resistor 1444 is R1, the following condition is satisfied:

$$G = 1 + \frac{R1}{R2}.$$

The calibration unit 18 may include the processor 180, the A/D conversion circuit 182, and the D/A conversion circuit 184 shown in FIG. 3. The A/D conversion circuit 182 and the D/A conversion circuit 184 are electrically connected to the amplifying unit 14, respectively. The A/D conversion circuit 182 receives the analog amplified signal from the amplifying unit 14 and configured to convert the analog amplified signal to corresponding digital electronic signal. The processor 180 may previously perform a digital filtering procedure 1806 for filtering the noise within the digital electronic signal and then performs one of a detect flow controlling procedure 1802, a calibration data maintaining procedure 1804, and an algorithm optimization procedure 1800 for generating the digital calibration signal to the D/A conversion circuit 184. The D/A conversion circuit 184 is configured to converting the digital calibration signal from the processor 180 to an analog calibration signal for calibrating the gain of the amplifying unit 14, so as to ensure that the amplified-quantized values from the amplifying units are equal to one or more specific values.

Figure 7:
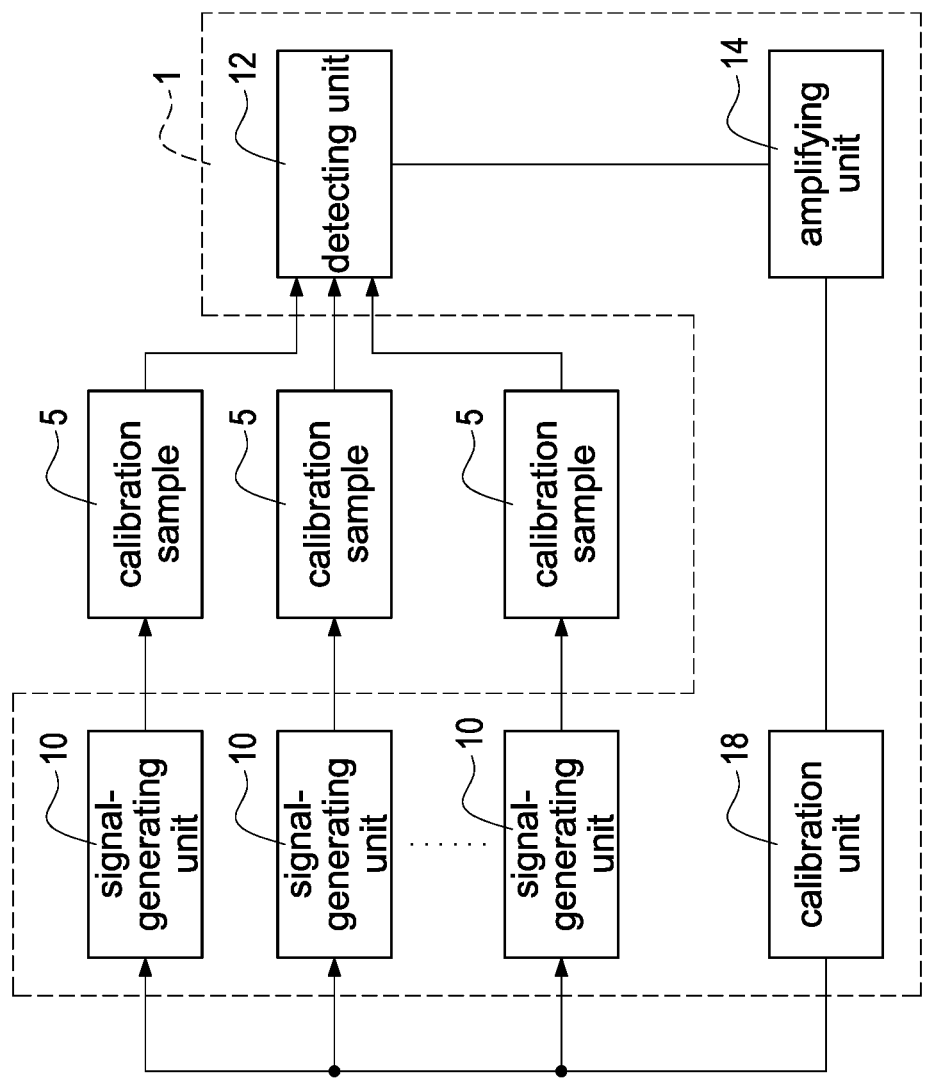
FIG. 7 depicts a schematic diagram illustrating the usage of a multi-channel detecting system in accordance with a 3rd embodiment of the present disclosure.

FIG. 7 depicts a schematic diagram illustrating the usage of a multi-channel detecting system in accordance with a 3rd embodiment of the present disclosure. In FIG. 7, the multi-channel detecting system 1 includes a plurality of signal-generating units 10, a detecting unit 12, an amplifying unit 14, and a calibration unit 18; the multi-channel detecting system 1 is configured to detect quantized values with respect to signals from the signal-generating unit 10 and transmitted through calibration samples 5 and ensure that the quantized values to be equal to one or more specific values. Therefore, the difficulty in recognizing the detection result is overcome and the accuracy of detection result during detection procedure is improved.

Each signal-generating unit 10 is configured to provide a signal; in this embodiment, the amount of the signal-generating unit 10 is equal to that of the calibration samples 5, and the detecting unit 12 may receive the signals from the signal-generating units 10 and transmitted through the calibration samples 5 and configured to the generating the quantized values in accordance with the signals from the signal-generating units 10 and transmitted through the calibration samples 5.

Each amplifying unit 14 is arranged between the detecting unit 12 and the calibration unit 18 and electrically connected thereto. The amplifying unit 14 is configured to amplify the quantized values from the detecting unit 12 and generate an amplified signal for the calibration unit 18. In should be noted that the circuit scheme of the amplifying unit 14 in this embodiment is the same as that shown in FIG. 2. The calibration unit 18 receives the amplified signals from the amplifying units 14 and configured to calibrate each amplifying unit 14 to ensure that the amplified signals from the amplifying units 14 are equal to one or more specific values.

The detecting unit 12 receives one of the signals from the signal-generating units 10 and transmitted through the calibration sample 5 and then generates the corresponding quantized value per unit time; the detecting unit 12 may instantaneously deliver the quantized value to the amplifying unit 14 for generating the amplified signal, and the calibration unit 18 then calibrates the signal-generating unit 12. However, in the practical applications, the detecting unit 12 may collect the quantized values corresponding to the signals from different signal-generating units 10 and then successively deliver one or more of the quantized values to the amplifying unit 14 for generating the amplified signals; therefore, the calibration unit 12 can calibrate each signal-generating unit 10 by the corresponding amplified signal.

Figure 8:
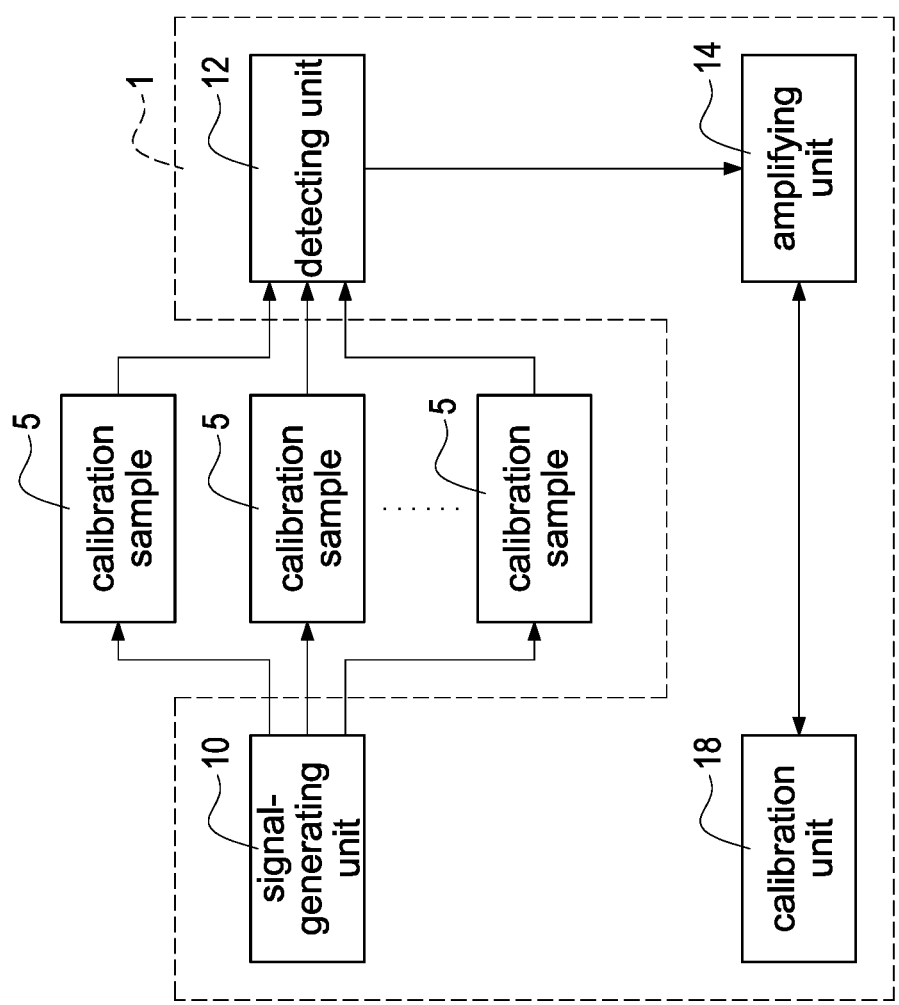
FIG. 8 depicts a schematic diagram illustrating the usage of a multi-channel detecting system in accordance with a 4th embodiment of the present disclosure.

FIG. 8 depicts a schematic diagram illustrating the usage of a multi-channel detecting system in accordance with a 4th embodiment of the present disclosure. In this embodiment, the signal-generating unit 10 of the multi-channel detecting system 1 is configured to provide a plurality signals; the multi-channel detecting system 1 is configured to generate quantized values with respect to signals from the signal-generating unit 10 and transmitted through calibration samples 5 and ensure that that the quantized values are equal to one or more specific values. Therefore, the difficulty in recognizing the detection result is overcome and the accuracy of detection result during detection procedure is improved.

In this embodiment, the signal-generating unit 10 is, for example, includes a signal expanding component, such as splitter, for expanding a single-channel signal from a signal generator, such as an LED, into multi-channel signals, so that the signal-generating unit 10 can provide a plurality of signals.

In FIG. 8, the multi-channel detecting system 1 includes a signal-generating unit 10, a detecting unit 12, an amplifying unit 14, and a calibration unit 18, which collectively detect the signals transmitted through the calibration samples 5 and then generate quantized values for calibration the signal-generating unit 10 to ensure that the signals from the signal-generating unit 10 are equal to the specific value. Therefore, the difficulty in recognizing the detection result is overcome and the accuracy of detection result during detection procedure is improved.

In this embodiment, the amount of the signals from the signal-generating unit 10 is equal to the amount of the calibration samples 5. The detecting unit 12 receives the signals from the signal-generating unit 10 and transmitted through the calibration samples 5 and configured to generate quantized values. The amplifying unit 14 is arranged between the detecting unit 12 and the calibration unit 18 and electrically connected thereto; the amplifying unit 14 receives the quantized values and configured to generate one or more amplified signals. The calibration unit 18 receives the one or more amplified signals and configured to calibrate the gain of the amplifying unit 14, so that the amplified-quantized values from the amplifying unit can be equal to a specific value.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. A multi-channel detecting system comprising:
   one or more signal-generating units configured to provide a plurality of signals;
   one or more detecting units configured to detect the signals provided by the one or more signal-generating units and transmitted through a plurality of calibration samples, and configured to generate a plurality of quantized values in accordance with the signals from the one or more signal-generating units and transmitted through the calibration samples;

one or more amplifying units electrically connected to the one or more detecting units and configured to receive and amplify the quantized values; and a calibration unit electrically connected to the one or more amplifying units and configured to calibrate the one or more amplifying units to ensure that the amplified-quantized values provided by the one or more amplifying units to be equal to one or more specific values.

2. The multi-channel detecting system of claim 1, wherein the calibration unit makes the amplified-quantized values provided by the one or more amplifying units to be equal to the one or more specific values by changing one or more gains of the one or more amplifying units.

3. The multi-channel detecting system of claim 1, wherein each amplifying unit comprises:
   a first operational amplifier, a non-inverting input terminal of the first operational amplifier electrically connected to the detecting unit;
   a capacitor connected across the non-inverting input terminal and an output terminal of the first operational amplifier; and
   two resistors, one of the resistors arranged between an inverting input terminal of the first operational amplifier and ground, and the other resistor electrically connected to the capacitor in parallel,
   wherein the first operational amplifier, the capacitor, and the resistors collectively amplify each quantized value and adjust a form of each quantized value.

4. The multi-channel detecting system of claim 3, wherein each amplifying unit further comprises:
   a second operational amplifier, a non-inverting input terminal of the second operational amplifier electrically connected to the output terminal of the first operational amplifier;
   a resistor arranged between an inverting input terminal of the second operational amplifier and ground; and
   a variable resistor arranged between the inverting input terminal and an output terminal of the second operational amplifier,
   wherein the second operational amplifier, the resistor, and the variable resistor collectively amplify each quantized value.

5. The multi-channel detecting system of claim 1, further comprising a noise cancellation unit arranged between the one or more amplifying units and the calibration unit, wherein the noise cancellation unit is configured to cancel noise within the amplified-quantized values from the one or more amplifying units.

6. The multi-channel detecting system of claim 1, wherein the calibration unit comprising:
   a processor;
   an analog to digital conversion circuit arranged between the one or more amplifying units and the processor; and
   a digital to analog conversion circuit electrically connected to the processor and the one or more amplifying unit.

7. The multi-channel detecting system of claim 1, wherein an amount of the one or more detecting units is equal to an amount of the calibration samples, and an amount of the one or more amplifying units is equal to the amount of the calibration samples.

8. A multi-channel detecting system comprising:
   one or more signal-generating units configured to provide a plurality of signals;
   one or more detecting units configured to detect the signals provided by the one or more signal-generating units and transmitted through a plurality of calibration samples, and configured to generate a plurality of quantized values in accordance with the signals from the one or more signal-generating units and transmitted through the calibration samples;
   one or more amplifying units electrically connected to the one or more detecting units and configured to receive and amplify the quantized values; and
   a calibration unit electrically connected to the one or more signal-generating units and configured to calibrate the one or more signal-generating units to ensure that the quantized values with respect to the signals from the one or more signal-generating units to be equal to one or more specific values.

9. The multi-channel detecting system of claim 8, wherein each signal-generating unit comprises:
   a signal generator;
   a switch electrically connected to the signal generator;
   a sensing resistor electrically connected to the switch; and
   an operational amplifier, wherein an output terminal of the operational amplifier is electrically connected to the switch, one of input terminals of the operational amplifier is electrically connected to a reference voltage, and the other input terminal of the operational amplifier is electrically connected to the sensing resistor,
   wherein the operational amplifier calibrates the one or more signals from the one or more signal-generating units to ensure the quantized values to be equal to the one or more specific values in accordance with a comparison between the reference voltage and a sensing voltage provided by the sensing resistor by sensing a current flowing through the signal generator.

10. The multi-channel detecting system of claim 8, wherein an amount of the one or more signal-generating units is equal to an amount of the calibration samples.

11. The multi-channel detecting system of claim 10, wherein an amount of the one or more detecting units is equal to the amount of the calibration samples, and an amount of the one or more amplifying units is equal to the amount of the calibration samples.

12. The multi-channel detecting system of claim 8, wherein each amplifying unit comprises:
   a first operational amplifier, a non-inverting input terminal of the first operational amplifier electrically connected to the detecting unit;
   a capacitor connected across the non-inverting input terminal and an outputting terminal of the first operational amplifier; and
   two resistors, one of the resistors arranged between an inverting input terminal of the first operational amplifier and ground, and the other resistor electrically connected to the capacitor in parallel,
   wherein the first operational amplifier, the capacitor, and the resistors collectively amplify the quantized values and adjust a form of the quantized values.

13. The multi-channel detecting system of claim 8, further comprising a noise cancellation unit arranged between the one or more amplifying units and the calibration unit, wherein the noise cancellation unit is configured to cancel noise within the amplified-quantized values provided by the one or more amplifying units.

14. The multi-channel detecting system of claim 8, wherein the calibration unit comprising:
   a processor;
   an analog to digital conversion circuit arranged between the one or more amplifying units and the processor; and
   a digital to analog conversion circuit electrically connected to the processor and the one or more amplifying unit.

* * * * *